US007613305B2

(12) United States Patent
Vieilledent et al.

(10) Patent No.: US 7,613,305 B2
(45) Date of Patent: Nov. 3, 2009

(54) METHOD FOR TREATING AN ELECTRIC SOUND SIGNAL

(75) Inventors: Georges Claude Vieilledent, Hedouville (FR); Jérôme Monceaux, Paris (FR); Jean Michel Raczinski, Saint Mandé (FR); Michel Corneloup, Cergy (FR); Yann Lecoeur, Ris-Orangis (FR)

(73) Assignee: Arkamys, Paris (FR)

( * ) Notice: Subject to any disclaimer, the term of this patent is extended or adjusted under 35 U.S.C. 154(b) by 0 days.

(21) Appl. No.: 10/550,230

(22) PCT Filed: Mar. 22, 2004

(86) PCT No.: PCT/FR2004/050120

§ 371 (c)(1),
(2), (4) Date: Apr. 28, 2006

(87) PCT Pub. No.: WO2004/086818

PCT Pub. Date: Oct. 7, 2004

(65) Prior Publication Data

US 2006/0215841 A1 Sep. 28, 2006

(30) Foreign Application Priority Data

Mar. 20, 2003 (FR) .................................. 03 50057

(51) Int. Cl.
*H04R 5/00* (2006.01)
*H04R 29/00* (2006.01)
*H03G 3/00* (2006.01)

(52) U.S. Cl. ............................ 381/17; 381/18; 381/19; 381/58; 381/61; 381/63

(58) Field of Classification Search ..................... 381/1, 381/17, 18, 19, 20, 21, 61, 58, 59, 63
See application file for complete search history.

(56) References Cited

U.S. PATENT DOCUMENTS 5,333,200 A * 7/1994 Cooper et al. .................. 381/1
5,357,257 A 10/1994 Nevin (Continued)

FOREIGN PATENT DOCUMENTS

EP 687 130 A2 12/1995

(Continued)

OTHER PUBLICATIONS

French Search Report, dated Feb. 13, 2004.

(Continued)

*Primary Examiner*—Vivian Chin
*Assistant Examiner*—George C Monikang
(74) *Attorney, Agent, or Firm*—Patterson, Thuente, Skaar & Christensen, P.

(57) ABSTRACT

A method for generating a sound giving a sensation of depth by applying, after extraction, a transfer function quadrille onto electric sound signals on the left and right thereof. The transfer functions simulate the trajectories taken by the sound associated with the electric signal to be processed in order to reach two receivers, if this sound was emitted in air. The signals that have been processed, one by one, by one of the four transfer functions of the quadrille, are combined with each other, then the sound signal thus obtained is mixed with the original electric sound signal to be processed after a temporal reset.

26 Claims, 6 Drawing Sheets

U.S. PATENT DOCUMENTS

| | | | | | |
|---|---|---|---|---|---|
| 5,818,941 | A * | 10/1998 | Embree | 381/22 |
| 5,960,390 | A * | 9/1999 | Ueno et al. | 704/200.1 |
| 6,535,920 | B1 * | 3/2003 | Parry et al. | 709/231 |
| 6,961,433 | B2 * | 11/2005 | Ishii | 381/17 |
| 7,181,019 | B2 * | 2/2007 | Breebaart et al. | 381/23 |
| 2003/0076973 | A1 * | 4/2003 | Yamada | 381/309 |
| 2003/0086572 | A1 * | 5/2003 | Sotome et al. | 381/17 |

FOREIGN PATENT DOCUMENTS

| | | | |
|---|---|---|---|
| EP | 1 017 249 | A1 | 7/2000 |
| FR | 2 738 692 | A1 | 3/1997 |

OTHER PUBLICATIONS

International Search Report, dated Aug. 26, 2004.
Written Opinion, dated Aug. 26, 2004.

* cited by examiner

METHOD FOR TREATING AN ELECTRIC SOUND SIGNAL

TECHNICAL FIELD

The present invention relates to a method for processing an electric sound signal. In particular the invention relates to the production of a sensation of depth with is electric sound signal at the time of diffusion.

BACKGROUND OF THE INVENTION

A flat sound without any depth gives the impression of coming from a plane situated next to the listener when heard from a certain distance. A sound with depth gives the more pleasant impression of coming from sound sources disposed in several depth planes with relation to the listener.

In the sound processing domain, the need to modify sound or original sound recordings in order to give the listener optimal listening comfort is known. Such is the case, for example, with sound from a film or audio support.

From document EP-A-1 017 249 is known a method designed for picking up sound, recording sound and reestablishing sound that reproduces the natural sensation of sound spaces. This method is implemented by means of sound pickup, recording and broadcasting equipment. In this method sound pickup is performed with two microphones simultaneously, respectively called right and left microphones. The set of microphones is displaced with relation to a sound source by varying the distance and the height of each microphone in a mainly differential manner with relation to the source. That is, one microphone is moved closer to the sound source when the other is moved farther away, and vice versa. This distance is managed in such a way that any one of the two sides of a virtual plane, that extends from one microphone to the other, is moved away from one microphone or the other. Therefore, the right microphone may become the left microphone. The two microphones may also simultaneously be moved closer and farther with relation to said source. This method, which may be described as acoustic-analog, allows a sensation of depth to be given to a well-defined type of sound: the sound for which sound pickup was performed by means of two microphones, and for the position and position variation of these two microphones at the time of sound pickup.

This method presents limits. Indeed, depending on the manner in which the microphones are moved during sound pickup, the recorded sound has a particular hue. This hue, also called color, may seem more or less agreeable or more or less effective considering the desired effects. Furthermore, this hue is not modifiable.

In addition, considering the nature of the method, a specific sound pickup must be performed for every new sound to be processed. This specific sound pickup means that as many pickups must be performed for new sounds as for new sounds to be processed, without guaranteeing the expected result. This last remark means that a buyer cannot have unprocessed sound and processed sound simultaneously unless he has purchased an unprocessed version and a processed version. Furthermore, the buyer cannot pass simply from one version of the sound to the other by activating or not activating the transformation by using a control button unless he has a dual reader.

In the invention, a stereophonic sound signal is preferably used, but a monophonic sound signal may be used. From a conventional left right sound, the method produces a sensation of depth that transposes the listener into a three-dimensional space. The invention finds applications that are particularly advantageous, but not exclusive, in the processing of original audiotape for film. However, the invention may relate to the processing of any music audiotape, whether the latter is, in addition, stored on a tape backing or on a disk. The invention is designed for, among others, sound engineers who can, from a conventional sound signal without depth that is available on a commercial support, apply transformations in such a way as to give volume and the desired enveloping to the sound. The invention also relates to industrial applications that consist of installing elements, for example memories, that incorporate the parameters that are necessary and sufficient for implementing sound processing according to the invention on large public machinery. Like the sound engineer, the end user may give the sound the desired depth at the desired time by using his stereo system, television or digital music reader controls.

SUMMARY OF THE INVENTION

The object of the invention is to remedy the problem of sound pickup multitude and availability by allowing digital sound processing to be applied to add depth to any original sound to be processed. The invention consists of digitally simulating a transformation that corresponds to the analog method for sound pickup cited above. This simulation is made possible because the parameters of this transformation have been determined beforehand. The parameters of this transformation are established by using a sound pickup configuration. In this configuration, two speakers are placed in a room next to an artificial head. The artificial head comprises two microphones simulating two human ears. To determine the parameters, digital detection of white noise received by each of the microphones of the head is performed. One considers that, for each of the speakers, two propagation paths are possible for reaching the microphones. This double path is broken down into a lateral path and a crossed path for each of the speakers. From this arrangement of speakers and microphones in space, different filters are extracted, four in one example (when there are two speakers and two microphones), corresponding to the four possible paths for sound. A filter of the transformation between a sound detected and a sound emitted for each path is mapped. The simulation then consists of processing any original sound by making it pass in a filter whose parameters conform to the transformation. One may apply said filters to any type of sound, in such a way as to digitally simulate the analogous trajectory of the sound. Lastly, in addition, by digitally combining the sound processed by the filters and the original sound, a sensation of depth is obtained that gives the listener the impression that the sound is three-dimensional. The listener may, by activating or not activating the filters, pass from conventional playback (flat) to playback in depth.

When they are combined, the original sound and the sound processed by the filters are preferably lagged in time.

Therefore, the invention relates to a method for processing an electric sound signal in which the following steps are implemented:

- an electric sound signal on the right and an electric sound signal on the left are processed to produce a processed electric sound signal on the right and a processed electric sound signal on the left, characterized in that to process,

- the production of a first processed electric sound signal on the right from the electric sound signal on the right is simulated, the production of a second processed electric sound signal on the right from the electric sound signal on the left is simulated, the production of a third processed electric sound signal on the left from the electric sound signal on the left is simulated, the production of a fourth processed electric sound signal on the left from the electric sound signal on the right is simulated, and a sound corresponding to these four processed electric sound signals is diffused.

The invention will be better understood upon reading the following description and examining the accompanying figures. The figures are presented for indication purposes only and in no way limit the invention.

BRIEF DESCRIPTION OF THE INVENTION

Figure 5:
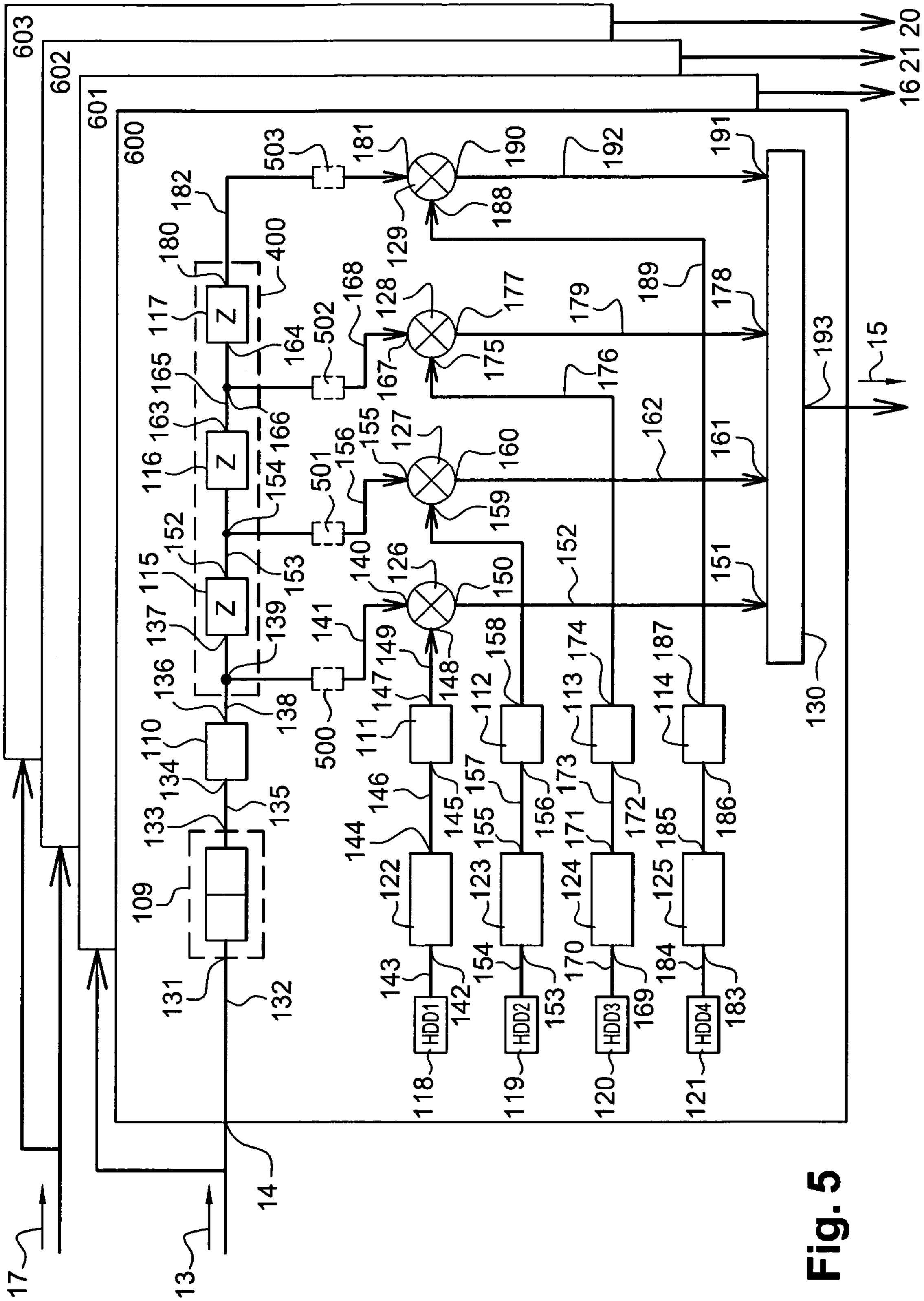
FIG. 5 is a block diagram depicting an embodiment of each of the filters.
Figure 6A:
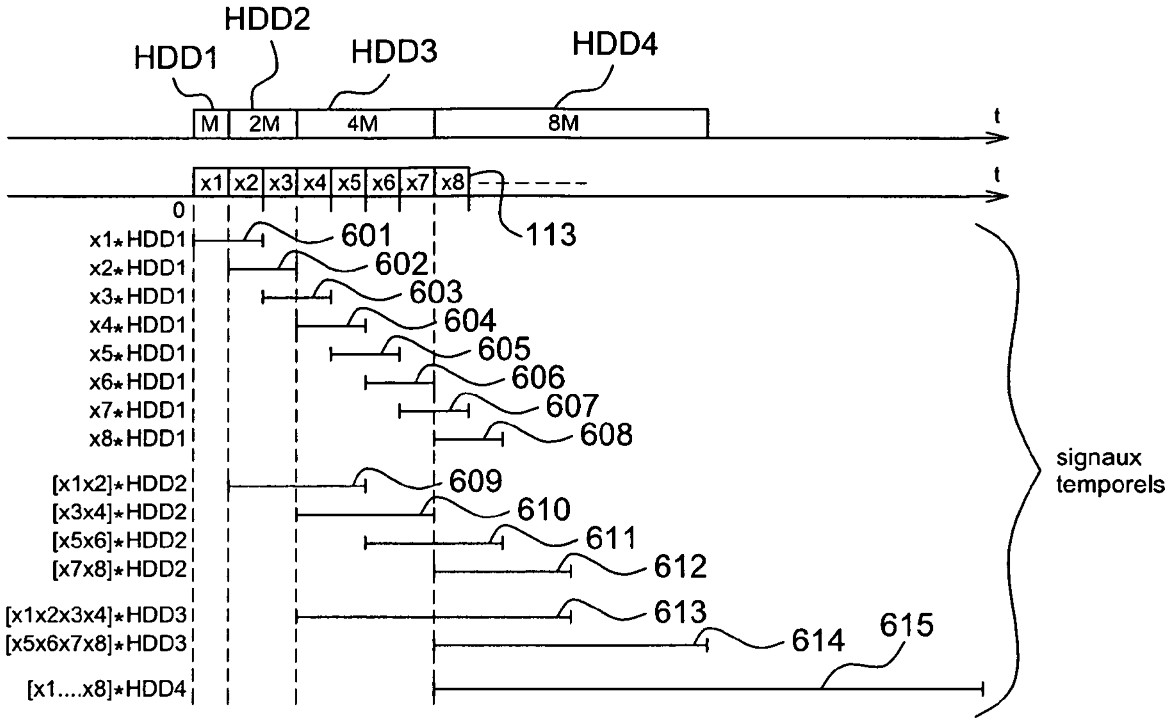

FIG. 6*a* depicts signals obtained from the filter of FIG. 5.

Figure 6B:
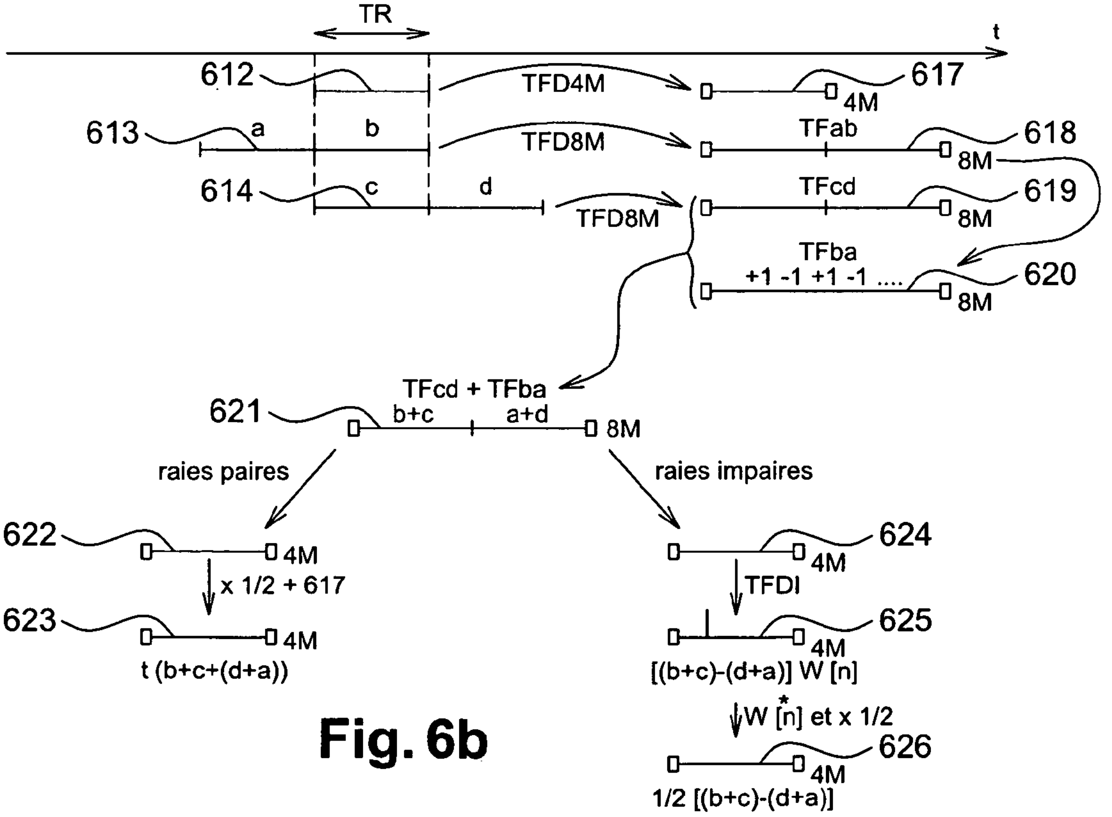

FIG. 6*b* depicts lines corresponding to signals that are situated in the temporal domain.

Figure 6C:
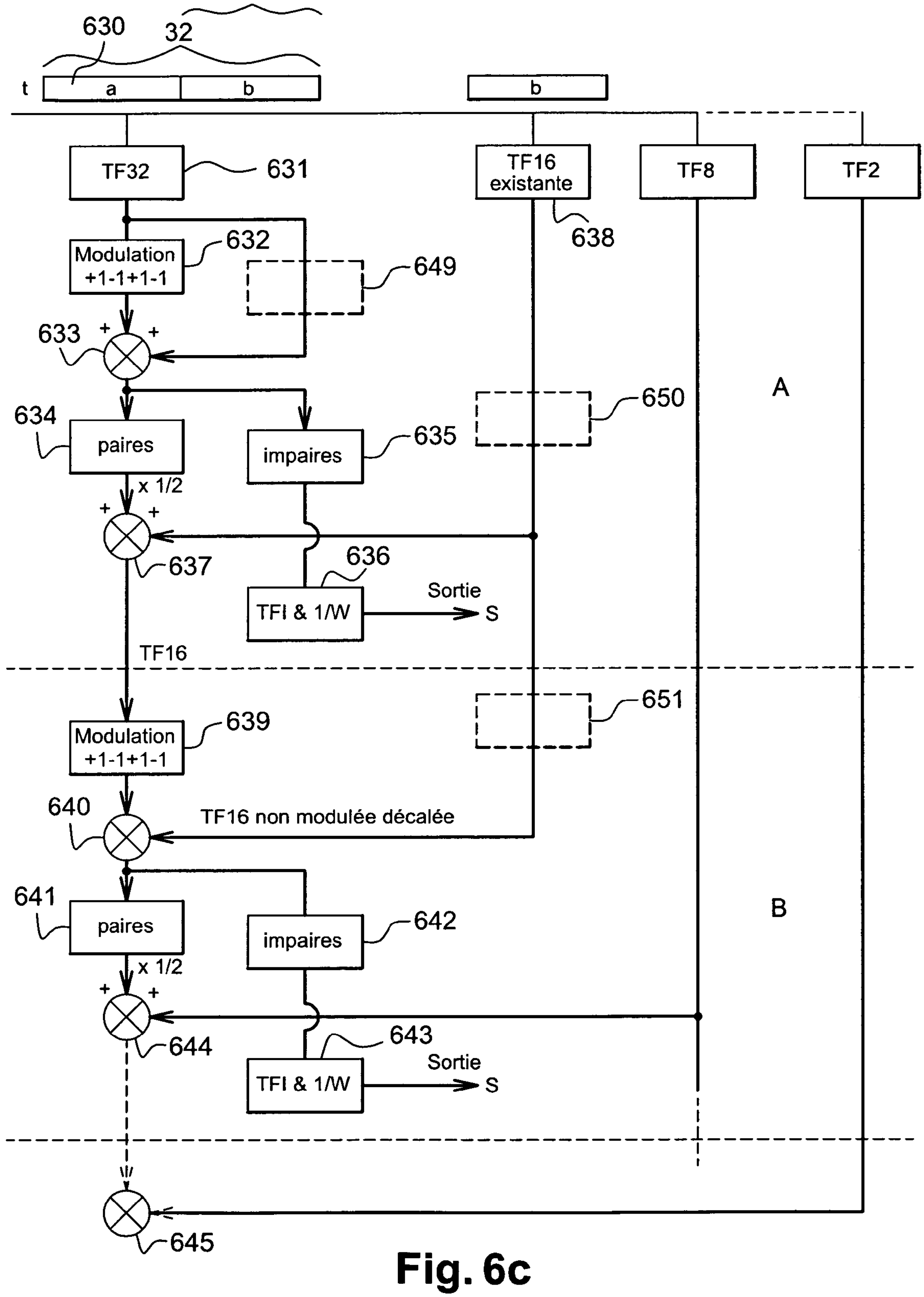

FIG. 6*c* is a block diagram depicting a filter.

Figure 7:
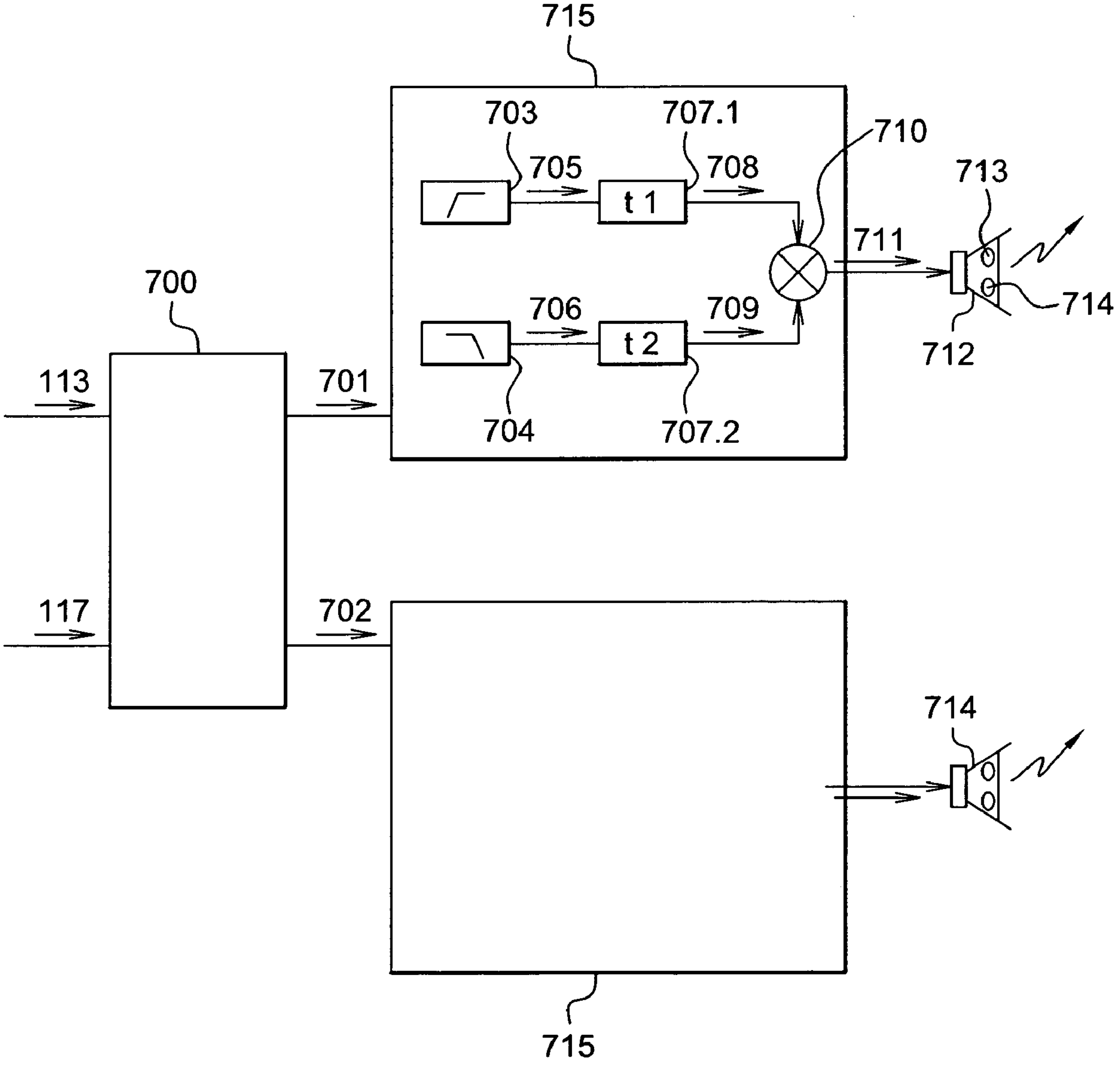

FIG. 7 is block diagram depicting a method for electric sound signals coming from a car radio.

DETAILED DESCRIPTION OF THE INVENTION

Figure 1:
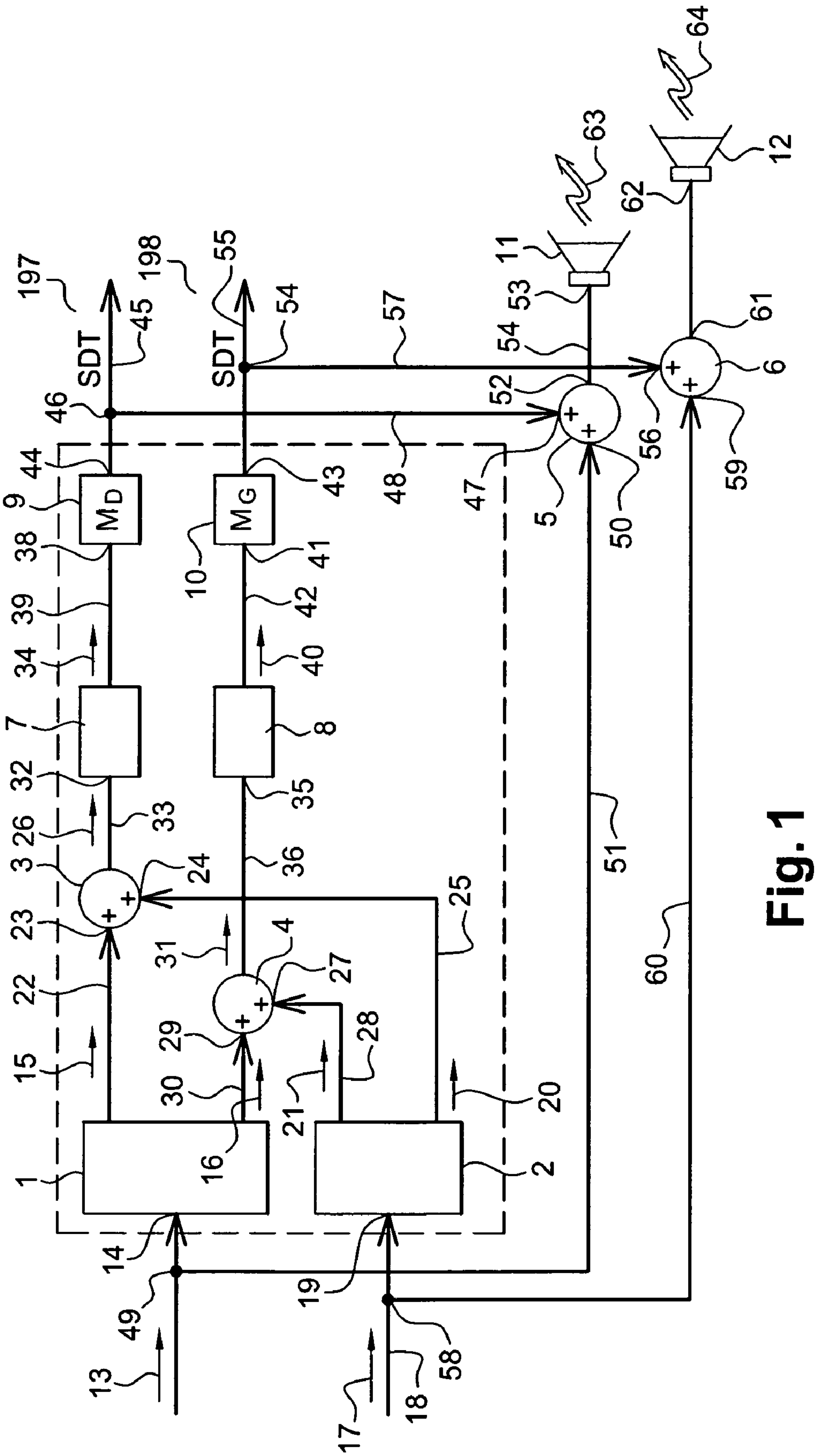
FIG. 1 is a block diagram depicting an assembly representing digital processing used for processing sound according to the invention.
Figure 2:
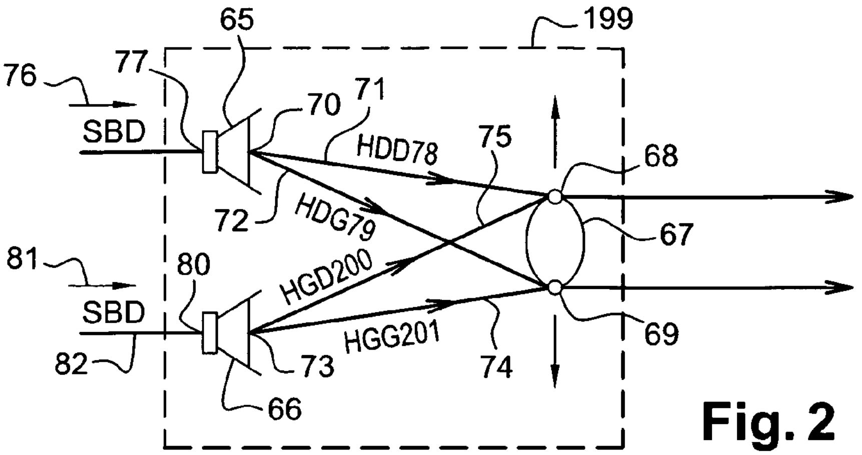
FIG. 2 is a schematic representation of a device used to extract the coefficients of filters, characterizing the different paths taken by the sound emitted from two speakers to the microphones of the head.

FIGS. 1, 2 and 5 represent an embodiment of the invention. Other embodiments may exist and may meet the definition of the invention.

FIG. 1 illustrates the principle of the method of digital processing of an electric sound signal of the invention with an assembly. The assembly comprises two filters 1 and 2 to simulate the different sound trajectories. In practice, the assembly also comprises four adders 3, 4, 5 and 6 to add two by two the signals filtered by the filters 1 and 2. At the end of these adders, and because in a preferred version the processing is frequential, two inverse discrete Fourier transform cells 7 and 8 allow the signals to be transposed in time. Two matrix transformers 9 and 10 allow the electric signal applied to the transformers as input coming from cells 7 and 8 to be processed. Two speakers 11 and 12 allow the sounds obtained that are issued by the matrix transformers to be diffused.

An electric sound signal on the right 13 is applied as input 14 of filter 1. The signal is divided on exit from the filter into a processed electric sound signal on the right 15 and a processed electric sound signal on the left 16. An electric sound signal on the left 17 is applied via the connection 18 as input 19 of the filter 2. This signal 17 is divided on exit from the filter 2 into a processed electric sound signal on the right 20 and a processed electric sound signal on the left 21. If the original sound is monophonic, the electric sound signals applied as inputs 14 and 19 are the same. This may be simplified by removing filter 2 and by using a combination of coefficients from filters 1 and 2 for filter 1. The four electric signals 15, 16 and 20 and 21 observed outputting filters 1 and 2 each correspond to the simulation of a path that the sound associated with the original electric sound signals had taken in air. By acting this way, one notices that the acoustic-analog transformation of the prior art cited has simply been digitally simulated. This simulation is applied to any original sound associated with signals 13 and 17. One may even decide to implement or not implement the invention by connecting or not connecting the inputs 14 and 19 to the filters 1 or 2 or to speakers 11 or 12. The connection may be made by switchings generated by a single control button on a front side of a device.

In the invention, the four signals are preferably combined as follows. The first processed electric sound signal on the right 15, obtained from the original electric sound signal on the right, is applied as input 23 of the adder 3 via a connection 22. The second processed electric sound signal on the right 20, obtained from the original electric sound signal on the left, is applied as the second input 24 of the adder 3 via the connection 25. Therefore an electric sound signal on the right 26 obtained from electric sound signals on the right 13 and from the original sound on the left 17 is obtained from the output of adder 3.

The third processed electric sound signal on the left 21, obtained from the original electric sound signal on the left, is applied as input 27 of the adder 4 via a connection 28. The fourth processed electric sound signal on the left 16, obtained from the electric sound signal on the right 13, is applied as input 29 of the adder 4 through the connection 30. Therefore a processed sound signal on the left 31, obtained from the electric sound signals on the right 13 and from the original sound on the left 17, is obtained from the output of adder 4.

In a preferred example, the signals 26 and 31 observed as the output of the two adders 3 and 4 are transposed in the frequency domain. Indeed, filters 1 and 2 are applied to the frequency spectrums of the input signals for greater ease of processing. The reason such processing is preferred will be explained below.

The processed electric sound signal on the right 26 obtained as output from adder 3 is applied as input 32 from an inverse discrete Fournier transform cell 7 via the connection 33, in such a way as to obtain as output from the cell 7, a processed electric sound signal on the right 34 transposed in the temporal domain.

Furthermore, the processed electric sound signal on the left 31 obtained as output from the adder 4 is applied as input 35 of an inverse discrete Fournier transform cell 8 via a connection 36. On output from the cell 8 of the inverse discrete Fourier transform, one obtains a processed electric sound signal on the left 40 transposed in time. Following the disclosure, we will discuss the discrete Fourier transform. However, it is possible to use other types of transform. One may use z transform circuits or other circuits. In addition, these transforms are discrete and appropriate for a digital calculation. However, an analogous simulation would be possible.

Signal 34 is applied via a connection 39 as input 38 of the matrix transformer 9. The transformer 9 performs a submatrix selection operation MD. This matrix operation MD has the role of selecting a part of signals from the input electric signal. As will be seen later in FIG. 5, some samples are redundant and are not significant to depth reproduction of the final sound. The matrix operation MD allows this problem with redundancy to be solved. Furthermore, the signal 40 obtained as output from the inverse discrete Fourier transform

8 is applied as input 41 of a matrix cell 10 containing an MG part via the connection 42, in such a way as to obtain as output 43 a signal that only maintains significant samples.

The transposed and modified processed electric sound signal on the right obtained as output 44 of the matrix transformer 9 and the transposed and modified processed electric sound signal on the left obtained as output 43 are then preferably combined respectively with the original electric sound signal on the right 13 and the original electric sound signal on the left 17, in the following manner:

The processed electric sound signal on the right, transposed and modified, that is observable in 44 is retrieved at the interconnection 46 of the connection 45 connected to the output 44 of the matrix cell 9. This signal retrieved in 46 is applied as input 47 of the adder 5 via the junction 48. The electric sound signal on the right 13 is retrieved at the interconnection 49 of the connection connecting the electric sound signal on the right 13 to the input of the filter 1. This retrieved signal is applied as input 50 of the adder 5 via the connection 51. The output 52 of the adder 5 is connected to the input 53 of the speaker 11 via the connection 54.

The processed electric sound signal on the left, transposed and modified, is retrieved as output 43 of the matrix cell 10 at the interconnection 54 of the connection 55. This signal is applied as input 56 of adder 6 via the connection 57. The electric sound signal on the left 17 is retrieved over the connection 18 through the junction 58. This signal is applied over the second input 59 of the adder 6 via the junction 60. The output 61 of the adder 6 is applied as input 62 of the speaker 12.

The sound resulting from the sound diffusion 63 of speaker 11 as well as the sound diffusion 64 of speaker 12 results in a combination, here additional, between the original electric sound signals 13 and 17 and the processed electric sound signals observable in 46 and 54. Preferably a time lag is introduced between the original signals and the processed signals, in such a way that the processed electric signals are emitted in advance with relation to the original electric sound signals. This combination of signals and time lag brings about a supplementary sensation of depth to the listener. The original sounds would have been unnecessary.

Of course, in monophonic utilization, the signals destined for the inputs of speakers 11 and 12 are mixed and diffused by a single speaker. In the context of such a use with the invention, in particular with a mobile telephone, better intelligibility of diffused sounds is observed. Especially with commercial messages accompanied by background sound, the listener better understands messages with processing from inventions than those without processing.

FIG. 2 is the analogous equivalent of the essential system of the invention in a dotted line in FIG. 1. From this assembly, the transfer functions that are present in filters 1 and 2 of FIG. 1 are deduced. This deduction forms the filter extraction phase. To do this, two speakers 65 and 66 as well as an artificial head 67 comprised of two microphones 68 and 69 situated on the head and oriented in the directions that form a 180° angle with relation to each other are placed in a room. In fact, they correspond to the ears of the artificial head 67.

The sound emitted as output from the speaker 70 is divided into two acoustic waves traversing the paths 71 and 72. The wave that takes path 71 reaches one of the microphones 68 of the head 67 by the shortest path. The acoustic wave 72 reaches the microphone 69 by the longest path 72. In the same manner, the sound emitted as output from speaker 73 reaches the head via two paths: part of the sound emitted goes from the output of the speaker 73 to the left microphone 69 via the path 74, the other part of the sound emitted goes from the output of the speaker 73 to the right microphone of the head 68 via the path 75. The acoustic waves or fields that take paths 71 and 74 comprise the lateral fields. The acoustic fields that take paths 72 and 75 comprise the crossed fields.

Although the artificial head may be situated anywhere in the room to simulate a particular sound trajectory and carry out an extraction phase, in a particular configuration, the artificial head 67 is situated on the median axis of the two speakers. An intermediate step therefore consists of placing the head very precisely on this median axis. To do this, the same pulse stream that corresponds to a Dirac comb applied as input to the speaker 65 and simultaneously as input to the speaker 66 is sent. In theory a Dirac is an instantaneous and infinite pulse; comb pulses here are very brief and of very high amplitude. The maximum amplitude of the Dirac is called the Dirac peak. During diffusion of pulse streams, the signals received by the microphones 68 and 69 are observed by means of an oscilloscope connected to the output of these microphones. The two channels of this oscilloscope are adjusted on the same time base. The signals observed have the appearance of a Dirac comb whose peak amplitudes are varied. On each channel, the Dirac peak of the highest amplitude corresponds to the direct field and the Dirac peak of the next lower amplitude corresponds to the crossed field. The position of the artificial head 67 may be varied until the direct fields and the crossed fields are synchronous, that is, until the peaks corresponding to the direct field and the peaks corresponding to the crossed fields observable on the oscilloscope are aligned two by two. Therefore the direct field received by the microphone 68 must be aligned temporally with the direct field received by the microphone 69 and the crossed field received by the microphones 68 must itself be aligned with the crossed field received by the microphone 69. After having performed this adjustment of the particular preferred configuration, it is certain that the artificial head 67 is found precisely at an equal distance from speakers 65 and 66.

As concerns the extraction phase, the phase must not be limited to the implementation of a device causing only two microphones and two speakers to intervene. Generally, if p speakers with q microphones are used, the crossed paths are multiplied. For each of p speakers, q paths are possible to reach q microphones. Such a device therefore leads to q coefficients for each of the speakers. To establish these q coefficients, the p speakers are isolated one by one.

In the simple and preferred case with two speakers and two microphones, this establishment is carried out from a sound pickup that is different from that of the acoustic-analog method above. In fact, in the acoustic-analog method studied in the prior art, the original sounds are emitted at the same time. In opposition, to extract the transfer functions from the filters of the invention, white noise acoustic signals are applied, singly and successively, to each of the speakers 65 and 66. White noise is used in this filter extraction step because white noise allows, in addition, the use of a maximum length sequence (MLS) method that particularly prevents outside noise from disturbing the experiment.

First, for one diffusion configuration, a white noise electric signal on the right RNS 76 is produced. This RNS 76 is applied as input 77 to the speaker 65. A white noise acoustic signal on the right is then emitted as output 70 of the speaker 65 and produces a modified white noise electric signal detected by microphone 68 because of the lateral path 71. Furthermore, a modified white noise electric signal is detected by microphone 69 due to the crossed path 72. The sound detected by the microphones is not white due to the propagation channel followed by the original white noise. This is how this sound detected from modified white noise is described. One may determine the transformation coefficients HDD 78 of filter 1 and HDG 79 of filter 1 respectively from the two signals detected by the microphones 68 and 69 of the head from the white noise electric signal on the right emitted. These coefficients result, for example, in a frequency division, frequency component by frequency component, complex point by point, between the frequency spectrums of electric signals detected by the microphones and that of the original white electric signal on the right. Therefore one obtains two sets of coefficients HDD 78 and HDG 79. The components of spectrums of the different phase extraction signals are complex points in the mathematical sense. In fact, each point produces information on the phase and amplitude of the signal to which it relates.

This frequency division in fact corresponds for HDD 78, to a first intercorrelation of the white noise electric signal as input with the modified white noise electric signal on the right in microphone 68. Then one performs, for HDG 79, a second intercorrelation between the white noise electric signal applied as input of speaker 77, with the processed modified white noise electric signal on the left detected by microphone 69.

Second, a white noise electric signal on the left SBG 81 is emitted only in input 80 of speaker 66 through the connection 82. The white sound signal on the left is emitted by the output 73 of speaker 66. A modified white received electric signal on the right that has taken path 75 is detected by microphone 68 of head 67. The microphone 69 detects a modified white received electric signal on the left that has taken path 74. A third set of coefficients HGD 200 linked to filter 2 is produced by making a point by point frequency division between the spectrum of the modified received white electric signal on the right 68 and the spectrum of the emitted white electric signal on the left SBG 81. A fourth set of coefficients HGG 201 connected to filter 2 is produced by making a point by point frequency division between the spectrum of the received white electric signal on the left in 69 and the spectrum of the emitted white electric signal on the left. An intercorrelation is performed once again to obtain these two filters.

Preferably, filters whose spectral length of filtering is a power of two are used since the algorithms utilized for the intercorrelation and the discrete Fourier transform utilize models optimized for this particular case.

These four sets of coefficients of four transfer functions form a quadrille of coefficients. These quadrilles and their characteristics give a certain color and certain depth to the processed sound. In fact, the transfer function coefficients of the filters take the channel taken by the sound into account, that is, the preamplifier of speaker 65 (or 66), the amplifier of speaker 65 (or 66), the propagation in the medium and the characteristics of the microphones. For each system, and for each configuration in space, the resonance associated with a quadrille may therefore be different.

Figure 3:
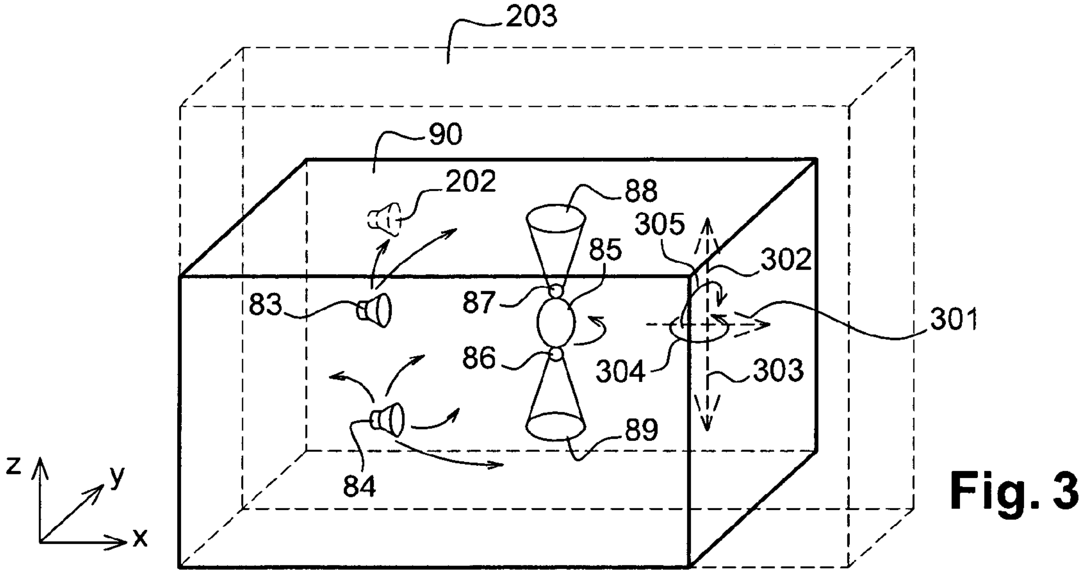
FIG. 3 is a perspective, schematic representation of the elements of the device for sound pickup of FIG. 2, also depicting the concept of the cone of confusion associated with the human ear.

As a matter of fact, FIG. 3 illustrates the fact that the transfer functions obtained during the extraction phase of FIG. 2 depend on the geometry of the device in space. Two speakers 83 and 84, as well as an artificial head 85 comprised of two microphones 86 and 87 differently oriented on the head by 180° from each other, are disposed in a room 90. The head 85 comprises two cones of confusion 88 and 89 that are characteristic of the human ear. The opening of the cones of confusion is between fifteen and twenty-five degrees. All the points of the section of the cone of confusion 88 or 89 have an identical inter-aural time difference. When a sound is emitted in one of the cones of confusion, the listener has a hard time situating the source of this sound. This phenomenon turns out to be interesting for particular sound pickups.

For each position of speakers in the room 90, the head 85 produces a different listening sensation. That is, the listener detects electric signals from different sounds, and this is translated by the quadrilles that are by nature different, with different coefficients for each position. The group of parameters corresponding to a fixed or mobile position of speakers and to a fixed or mobile position of microphones is called the configuration of the system. Once positioned, the elements of a configuration preferably remain static during the sound pickup that leads to the determination of filter coefficients. The position of speakers 83 and 84, of head 85 and of microphones 87 and 86, as well as their orientations are so many parameters that, taken separately, act on the nature of the electric sound signal that is captured by the microphones. In fact, the variation in distance from head 85 to speakers 83 and 84 causes the transit time of sound in air to vary. For example, the quadrille obtained for the configuration of elements 83, 84 and 85 in room 90 does not produce the same resonance during processing as the quadrille obtained from a configuration in which the head 85 was moved backward 301, elevated 302, or lowered 303, or turned on itself 304 or 305. The quadrilles may even be changed if a speaker or two speakers are displaced according to directions x, y or z.

The dimensions of room 90 also have an influence on the sound detected by microphones 86 and 87. By modifying the dimensions of the room, 90 becoming 203, one modifies the nature of the reflections of sound emitted by speakers 83 and 84 on the walls of the room. In room 90 and room 203, the speakers and the microphones have identical relative positions. As the wall perpendicular to axis x of room 203 is smaller than that of room 90, the reflections are more numerous along axis y in room 203 than in room 90. The quadrilles that are connected to the nature of the acoustic wave detected, and to its strength and frequency, therefore are different from one room to the other.

By modifying the orientation of speakers 83 and 84 or the microphones of the head, the angle of sound reception by the microphones of the head is modified. Therefore, the appearance of the wave received is again modified.

One notices that the further head 85 is moved from speakers 83, 84, the more significant the effect of depth produced by the quadrilles obtained. By placing the two speakers symmetrically on both sides of the head in the cone of confusion, a sensation of maximum envelopment and immersion is obtained than is obtained with difficulty with other positions.

From all these sound pickups with different natures, specific or singular configurations are retained that produce quadrilles making the best depth of sound listening effect. If necessary, one may retain several quadrilles (corresponding to several configurations).

Figure 4:
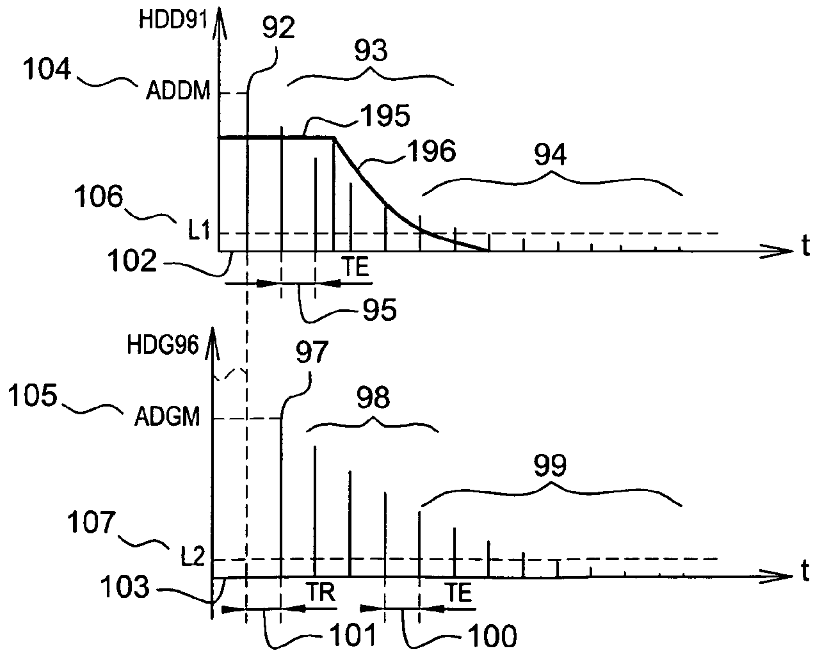
FIG. 4 is a graph presenting an aspect of an example of a right lateral filter and a right/left crossed filter.

FIG. 4 represents in a theoretical manner two particular sets of coefficients from one of two filters obtained after the extraction phase described in FIG. 2. FIG. 4 illustrates a processing that is performed on the filters to make them more effective. In this object, the coefficients from raw filters are determined according to the intercorrelations seen above. Then, from these raw coefficients, the impulse response for these filters is established by an inverse discrete Fourier transform. There here we pass to the calculations of filters (not for their use) in the temporal domain. Such an impulse response is shown in FIG. 4. The diagram for HDD filter 91 gives the appearance of the impulse response. This impulse response allows the corresponding lateral field to be deduced. The presence of an amplitude corresponding to the direct field 92 is seen on this filter. This ADDM amplitude is the largest of the amplitudes. The direct field corresponds to the field that, from the sound source, transits the shortest path to the receiver. Also amplitudes of first reflections 93 that are still significant are observed. Lastly, the amplitudes of the diffuse field 94 become increasingly weaker. The weakest do not play a large role in the processing of sound because they are concealed in the measurement noise. Impulse response HDD 91 has a sampling period TE in relation with the step of the initial Fourier transform and with the initial temporal sampling of the signal.

Diagram HDG 96 gives the appearance of the impulse response of the crossed field from an electric sound signal on the right. Its appearance is very similar to that of the impulse response of HDD 91 since the two sets of coefficients have been obtained from the same white noise. The amplitude of the direct field 97 that corresponds to the acoustic field directly received by the microphone is again the most important of the filter. The first reflections 98 produce amplitudes that are significant and the weakest amplitudes from the diffuse field 99 present little interest in the processing of sound because they are concealed in the measurement noise. Preferably, the sampling period is the same as for HDD 91: it equals TE, reference 100.

After having thus transformed the sets of coefficients HDD 91 and HDG 96 under a temporal form, the samples resulting from this transformation are processed to modify these filters. After this modification, the impulse responses modified in the frequency domain are retransposed to obtain frequency coefficients of filters and to then use the corresponding filters as conventional frequency filters. The part of the description that follows indicates how this modification is made on the impulse responses to give more color to the sounds thus subsequently filtered.

In the example, one observes that the direct field 92 of the temporal filter HDD 91 and the direct field 97 of the temporal filter HDG 96 are lagged in time by a duration TR, 101, called inter-aural. A first step consists of resetting the filters with relation to each other by aligning the direct fields or by choosing a discrepancy TR appropriate for the desired sound ambience. To vary or delete the duration TR, one may introduce or remove zero samples between the first significant sample, 92 or 97, and the original zero on the durations 102 or 103. This introduction or this removal leads to the sound being spread out more or less in space.

A second step consists of normalizing the temporal filters of the impulse responses. First one searches for the maxima impulse response fields. In the example, the maximum HDD 91 are searched which correspond to ADDM 104 and the maximum HDG 96 that here correspond to ADGM 105 are searched. One then searches for the maximum of these two maxima. The maximum found is reduced to one and the level of other impulse components of filters is normalized. In the case where the levels of impulse components of filters are too disparate, normalization by reducing a maximum to one is no longer possible since it makes the diffuse field of one of the filters 94 and 99 too significant.

Normalization by the strength of the impulse response from the average quadratic may then be proposed by applying an identical window on the filter assembly, and by calculating its strength. One then equalizes the levels to obtain an identical strength on the four windowed filters.

To produce certain sound effects, temporal masks may furthermore be applied to the impulse responses of filters HDD 91 and HGD 96. For example, one may extract only the direct field from HDD 91 and deduce a frequency filter determined only from this direct field. This frequency filter is then applied on the electric signal 13. One may also apply a rectangular mask 195 that eliminates the coefficients whose rank is greater than a given rank, or even a mask terminating in exponential form 196 in order to modify a specific part of the filter.

A random alteration of amplitudes of certain samples may in addition be performed, still in the object of creating a particular sound atmosphere.

One may also eliminate certain samples whose amplitude is less than a threshold, for example L1 106 or L2 107. This threshold may correspond to a level of noise. In fact, samples wherein the level is less than the level of noise do not have a large influence on the quality of the sound processing given by the filter.

One may also delete certain samples, notably the weakest samples, by performing a deletion in such a way that the processing can be adapted to the device actually used to achieve this. In fact, the size of the filter must be adapted to the manufacturing constraint as, for example, the size of the available memory in the processing system or even the calculating capacity of the processor. In practice, sixteen thousand coefficient filters are used, each coefficient being quantified over sixty-four bits. Therefore, sixteen thousand samples are in the impulse response that may lead to sixteen thousand coefficients in the frequency domain. If the system resources are low, one may reduce the number of coefficients to four thousand or to two thousand. Below these values, results from processing are still present but are less well controlled.

For the processing of the original signal by the temporal coefficient filters, first the coefficients of these temporal filters are transposed in the frequency domain thanks to the discrete Fourier transform cell 111-114. The signal thus processed may, however, appear unacceptable and may necessitate a supplementary equalization processing. Rather than perform such a supplementary equalization processing on the electric sound signal 13, in the invention one plans to incorporate equalization functions in the cells situated upstream from the Fourier transform cells 111-114. The equalization functions modify the filter coefficients in amplitude and in phase on all or part of the impulse response. It has been discovered that the control of the phase is a critical point in all filterings connected to spatialization and depth production of sounds. For example, one may modify in phase and in amplitude the direct field coefficients and the first reflections while leaving the diffuse field coefficients unchanged.

The object of these equalization functions may be to improve the spectral rendering of a filter or a sound by correcting or by compensating for certain defects that may be linked to the sound pickup. For example, a listener may want to increase the amplitudes of certain frequency components in such a way as to emphasize one sound color more than another. In this object, the cells situated upstream from cells 111-114 may be parametered for some or all frequency ranges by the weighting coefficients. In the equalization, all the frequency components of four filters may even be adjusted independently by planning to modify the weighting coefficients of the cells independently. This independence produces the possibility of modifying all characteristics of the amplitude and phase levels of different filters.

Rather than use the cells upstream from cells 111-114, it would be possible to incorporate the equalization functions directly in cells 111-114. It would also be possible to parameterize cell 110 or cells 7 and 8 by the weighting coefficients. Nevertheless, these alternatives are more complicated and limiting than the use of independent cells allowing equalization to be performed before transposing the coefficients of filters in the frequency domain.

FIG. 5 represents, in block diagram 600, a possible embodiment of the circuit that exploits the extracted filtering coefficients. Signal processing is carried out by dividing the data to be processed into N blocks of data that are multiplied by N packets of coefficients. In this case, we set out to implement HDD 78, with four coefficient packets, here N equals four. The filtering coefficients of HDD 78 are present in filter 1 of FIG. 1. They permit the processed electric sound signal 15 as output to be obtained from the applied signal as input 14.

The coefficients of a filter, therefore from filter HDD 78, number sixteen thousand and are each defined on four bytes. With N equal to four, these coefficients are divided into four coefficient packets of four thousand coefficients each. The input signal that is processed by HDD 78 is an electric sound signal divided into blocks of four thousand words. Each word represents a sample of coded data also on four bytes. In the assembly, four distinct processing steps are performed that are combined by an adder 130.

Generally, for processing, the circuit of FIG. 5 performs a discrete Fourier transform of data blocks, across a cell 110, from the signal 13 transmitted by a connection 132 to a memory 109. A signal transposed in the observable frequency domain is obtained as output 136. This transposed signal is then multiplied by the filtering coefficients of a filter.

The coefficients of this filter are contained in the example in four read-only memories, HDD1 118, HDD2 119, HDD3 120 and HDD4 121. These coefficients are multiplied with the available signal as output 136 through the operators. The multiplied signal obtained, 15 in the example after the adder 130, is then transposed in time by an inverse discrete Fourier transform modeled in the example by cell 7 of FIG. 1.

To multiply the input signal by the filter coefficients, in the frequency domain, the electric sound signal to be processed 13 is grouped into two groups of consecutive blocks in time. These groups of two transformed blocks are then transmitted to a delay line 400 with four outputs 136, 152, 163 and 180. The delay available at output 136 is zero. In practice, the line 400 only comprises three delay cells 115, 116, 117. Beforehand the transformation of each of these groups of two blocks is performed by using the discrete Fourier transform circuit 110. The filtering coefficients are divided into N packets that correspond to four coefficient packets of example HDD1 118, HDD2 119, HDD3 120 and HDD4 121. These packets may be contained in a read-only memory; however, one may contemplate calculating the packets on the fly.

In the object of controlling the phase of the electric sound signal, the coefficient packets used in the example, HDD1 118, HDD2 119, HDD3 120 and HDD4 121, are packets of coefficients from finite impulse response filters. The number of coefficients from this type of filter is finite.

As with the N blocks of the input signal, the N packets of filtering coefficients are transposed in the frequency domain through discrete Fourier transform cells 111-114. After transposition, the N blocks of the electric input signal and the N packets of filter coefficients are multiplied two by two across the multiplication operators 126-129 of the circuit from the example where N equals four. Transposing the different signals to be processed in the frequency domain, the blocks from the input signal and the coefficient packets, has the effect of facilitating convolution by transforming convolution into a simple multiplication in the frequency domain. This same convolution would have been difficult to calculate in the temporal domain and would have demanded more system resources, especially more memory. The N results obtained are then added between them by the adder 130. By acting this way the filtering has broken down into N multiplications. This is simpler.

The input signal frame divided into blocks and observable as the output of cell 110 is transmitted to the delay line 400 at four outputs. Each of cells 115-117 delays the signal that is applied to it as input by one sample block. By acting this way, the input frame is divided into N blocks, four in the example, that are observable at the interconnection points 139, 154, 166 and 182. Furthermore, the cells 115-117 prevent the convolution results from being superimposed when the sum is performed. Therefore coherent processing is maintained while having divided the filtering coefficients of HDD 78 into N packets.

The transform of signal 13 may be calculated on each of the signals observable on N outputs of the delay line 400, by placing in the example discrete Fourier transform cells 500-503 on connections 141, 156, 168, 182. One may also, and this is the preferred solution, calculate the Fourier transform for the frame assembly by placing a discrete Fourier transform cell 110 upstream from the delay line.

To divide the frame into blocks, an input electric signal, 13 in the example, with a capacity proportional to the Nth frame is stored. In a preferred embodiment, the double blocks that half-cover each other are formed by a memory 109 for dividing the input frame into N blocks. In the example, the memory capacity 109 that here is a buffer memory is two times greater than the size of an electric sound signal 13 block. The buffer memory of eight thousand words of four bytes is therefore divided into two blocks of four thousand words each. This implementation allows successive groups of two data blocks overlapping each other by fifty percent to be disposed (in time). The groups of data blocks output from memory 109 therefore have a size of eight thousand words. By dividing the size of the input buffer memory by two (eight thousand words instead of sixteen thousand words), and by adapting an overlap, the circular buffer memory 109 reduces the latency time of the processing. The latency time is the duration elapsed between the input in the processing system of the first sample to be processed and its effective processing by the system. This latency time is connected to the filling time of the input buffer memory. This processing technique introduces an overlap of samples, therefore allowing fast processing of input signals to be filtered. In the invention, an overlap with a level of fifty percent is used, although this is not the only value possible. One may contemplate, for example, using an overlap that is greater than twenty-five or thirty-three percent. A Fourier transform of these double blocks is then performed, as seen, through the discrete Fourier transform cell 110 and via the connection 135.

The N packets of filtering coefficients: HDD1 118, HDD2 119, HDD3 120 and HDD4 121 of the example are completed by constant samples by using idle cells 122 to 125. In practice, the complement is performed by zero samples introduced by idle cells to zero but one may introduce constant value samples, not zero, in order to vary the effects to be performed on the original sound to be processed. One then obtains N double packets observable in the example as output 144, 157, 171 and 185 of cells 122-125 of the circuit of the example where N equals four. Cells 122-125 are idle cells at zero. These cells 122-125 are used in such a way as to be able to multiply two signals although they may not have the same size. The idle cells at zero complete in fact the signals that are applied to them as input by the zero samples until the latter reach a size allowing an operation to be carried out. Therefore as outputs from idle cells, signals of eight thousand words are observed while the signals applied as inputs 142, 153, 169 and 183 only have a length of four thousand words. This supplement of samples is necessary so that the multiplication is physically attainable between N double blocks of the input signal and N packets of filtering coefficients. In fact, multiplication is possible only if the sizes of sampled signals that are available over the different inputs of the multiplier are identical to each other.

Calculation with the covered double blocks and with the coefficient packets tamped to zero leads to a redundancy. Considering the choice of processing (one could have done otherwise), this should extract significant results. These double multiplied blocks are extracted from blocks multiplied by using a matrix operation. This matrix operation is performed in the example across the matrix cells 9 and 10 selecting a part of the incoming block in such a way as to eliminate the redundancy of samples due to the use of a circular buffer memory that results in a double processing of samples.

The signal 13 is thus transformed into signal 15. This transformation corresponds to the filtering HDD 78. To correspond with other filters HDG 79, HGD 200 and HDG 2001, from signals 13 and 17 (see FIG. 1), the assembly of FIG. 5 comprises three other functional blocks 601, 602, 603 as the functional block 600 that has just been described. The same type of processing grouping together a combination of signal, an inverse discrete Fourier transform, and a matrix operation is performed on the other signals 13 and 17 in order to simulate the paths of sounds in air. Signal 16 is obtained in the example from a filtering carried out on signal 13. Signals 21 and 20 are obtained from two filterings performed on signal 17 of filter 2. The three blocks 601-603 have a structure similar to that of block 600.

With the development of the method of the invention, N, which equals four in the preferred embodiment, may be increased. In fact, the larger the N, the more the size of the input buffer memory diminishes for a filter with a given length. Therefore, the latency time diminishes when N increases. Under these conditions, one may contemplate a near-real time processing in time of the original sound signal (without depth). Particularly, one may contemplate using the processing of sound signals of the invention for sounds corresponding to images that are directly transmitted.

One may also divide the impulse responses of the filters and the input signal into blocks of variable size. The smallest block defines the latency time. Preferably, it corresponds to the start of the impulse response of the filter. For example, one may start by processing 128 temporal samples, then on to the following step by processing 256, then 512 and so on, by increasing the size up to the end of the impulse response. More generally, for example a first block of N points is processed, the next processing is over 2N points, the next over 4N, etc., up to the end of the response. Other variations, which are more effective for real-time processing, are possible: N, N, 2N, 2N, 4N, 4N, etc. More generally, when one mentions blocks, although they preferably have equal sizes, they may have unequal sizes. By disposing several simulation quadrilles, it is possible to have filterings corresponding to other complementary configurations available for users, in memories such as 118 to 121. Therefore, one contemplates having about twenty different configurations (and associated filterings) available to the users. Furthermore, it is possible that a user would want to combine the effects of several quadrilles. In the invention, adding the respective coefficients from two quadrilles is then expected (and normalizing the addition by a division by two) or more than two quadrilles. Memories 118 to 121 are then loaded by the coefficients resulting from this combination.

FIG. 6*a* shows signals 601-615 obtained in an embodiment of the filter 600 from FIG. 5.

Signals 601-615 here are represented in a temporal domain but, as will be seen later, all input signal processing calculations 113 by the filter HDD 78 are performed in the frequency domain, by using Fourier transform cells.

In this variation, the filtering coefficients from filter HDD 78 are divided into four time slots of coefficients with variable lengths, or here four slots HDD1-HDD4 respectively with lengths M, 2M, 4M and 8M points. The number of temporal samples comprising these slots is multiplied by a power of two since the calculation of the discrete Fourier transform is faster and easy to implement with such a number of samples. In practice, slots HDD1-HDD4 of coefficients, successive in time, have larger and larger lengths Input electric sound signal 113 is divided into blocks x1-x8 whose size is equal to that of the smallest coefficient slot, or here slot HDD1 that has a size of M.

One then calculates a Fourier transform of blocks x1-x8 and of these slots HDD1-HDD4 of coefficients, by using Fourier transform cells. One then obtains transformed blocks and transformed slots.

One then convolves the signal slots HDD1-HDD8 by blocks x1-x8 with the same length as each of the slots. Thus, one convolves the first slot HDD1 that has a length of M samples or points, by the block x1 with a length M samples or points, then by blocks x2, x3, x4, x5, x6, x7 and x8. The second slot HDD2 that has a length of 2M points is convolved by double blocks x1x2, x3x4, x5x6 and x7x8 with a length of 2M points. These convolutions are performed in the frequency domain (circular convolution), by multiplying the Fourier transforms of the blocks. By multiplying the blocks transformed by the slots transformed, one obtains multiplied blocks in this sense. A multiplied block in the frequency domain corresponds to a convolved block 601-615 in the temporal domain. The Fourier transforms are taken in order double the length of temporal blocks so that the circular convolution is identified with the linear convolution.

The multiplied blocks corresponding to the convolved blocks 601-615 have a length that is two times longer than the lengths of the initial blocks.

The convolution of blocks x1-x8 by slots HDD1-HDD4 induces convolved blocks 601-615 that are lagged in time with relation to each other. Thus, for a convolved block of a given size, the following block is lagged in time.

For example, a convolved block 609 with a length $2P \times M$ points, P being a positive whole number (here P=2), is delayed by a duration corresponding to $(2(P-1)-1 \times M)$ points (here 1) with relation to the start of the block.

Therefore, transformed blocks x1-x8 are multiplied by transformed HDD1-HDD4 slots of coefficients, in such a way that the convolved blocks 601-615 are aligned by overlay. For example, see for this purpose, the overlay of convolved blocks 601 and 602 that are partially overlayed during the duration of the sample x2. Furthermore, 611, 610 and 606 are overlayed during the sample duration x6x7.

One considers that the filter is a sum of four subfilters associated with slots HDD1-HDD4 delayed in time. It is then possible to deduce the overall impulse response of the filter HDD 78 by adding different multiplied blocks in frequency that are overlayed then by performing the inverse Fourier transform of the sum.

In practice, to calculate a Fourier transform on the order of $2P \times M$, the Fourier transforms on the order of $2(P-1) \times M$ are maintained in memory. Thus, with this method, once the transformations of block x1 and block x2 with a length of 2M points have been calculated, these transformations are combined in order to obtain the Fourier transform of x1x2 with a length of 4M points. In other words, instead of calculating a Fourier transform with a length of 4M points, one only calculates the supplementary Fourier transform of length 2M points.

This calculation method allows the processing time of data to be optimized for long Fourier transform calculations. However, it is difficult to perform inverse operations for calculating inverse Fourier transforms. In fact, the overlay of multiplied blocks transposed in time leads to difficulties in identifying a part of a signal that is useful for reconstruction. Reconstruction is understood to mean to transpose multiplied blocks in time, and to combine them in such a way as to obtain an overall response for the filter. More precisely, during reconstruction, one cannot measure a lag between the multiplied blocks that are situated in the frequency domain as one may measure the lag in the temporal domain. This complexity leads to a loss of time in the calculations.

Therefore in conventional reconstruction methods, to calculate an inverse discrete Fourier transform from a block of a given length, the inverse discrete transform of this block is directly calculated. On the other hand, in the invention, for faster calculation, an inverse discrete Fourier transform of a block with a given length is replaced by a half-order inverse Fourier transform.

Over a given period, only one part of the multiplied blocks has influence on the reconstruction of the output signal. Therefore, for convolved blocks corresponding to multiplied blocks 612, 613 and 614 that overlap, only the part that is overlapped has a contribution on an interval delimited in time by the multiplied block transposed in time 612.

Thus, in the invention, convolved blocks are grouped together, for example 613 and 614, with a length of 2P×M points in order to obtain a first block with a length 2(P−1)×M points (621, FIG. 6*b*) to be added to another convolved block with a length of 2(P−1)×M points (620 FIG. 6*b*). With this grouping, one obtains a second block (623 FIG. 6*b*) with a length of 2(P−1)×M points due to which an error in time made on the calculation of the first block is offset.

Thus, in the method according to the invention, one may replace a direct discrete transform of a given order with a direct discrete Fourier transform of a half order. But one may also replace an inverse discrete Fourier transform of a given order by an inverse discrete Fourier transform of a half order in order to reconstruct the filter.

In the method according to the invention, it is therefore always possible to calculate the direct discrete Fourier transforms and the inverse discrete Fourier transforms on the blocks having half lengths of desired cells.

FIG. 6*b* gives an example of a temporal reconstruction of the output of the filter by using the method according to the invention. More precisely, FIG. 6*b* shows an example of reconstruction for convolved blocks with a length 8M and 4M points. This figure is described in the framework of the present invention relative to sound processing but may also be the subject of independent protection considering that the technique of increasing the calculation speed is therefore obtained in all domains.

Segments from FIG. 6*b* whose extremities are lines correspond to signals that are situated in the temporal domain. Segments whose extremities are rectangles represent signals that are situated in the frequency domain.

To reconstruct the output signal of filter HDD 78 in a time interval TR associated with block 612, a first temporal contribution comes from convolved block 612 and a second temporal contribution comes from an overlay of two convolved blocks 613 and 614 (also see FIG. 6*a*). In fact, in the temporal domain, the convolved blocks 613 and 614 are respectively comprised of two halves a, b and c, d and are overlayed by half over interval TR. The contribution of convolved blocks 613 and 614 over interval TR is therefore (b+c).

In the reconstruction according to the invention, the blocks multiplied with a length 2P×M points corresponding to convolved blocks overlapping by half are therefore combined in the frequency domain, and one obtains a combined frequency block with a length of 2P×M points. Then this block is divided into two blocks with a length of 2(P−1)×M points and only the inverse transform of one of them is calculated, the other is simply added to a transform of order 2(P−1)×M issued from the processing of blocks of temporal signals with a length of 2(P−2)×M points.

More precisely, one utilizes multiplied blocks 617 to 619 respectively associated with convolved blocks 612, 613 and 614. Multiplied block 618 with a size of 8M that is overlayed in time with block 614 is modulated. To modulate, one multiplies the odd components of the multiplied block 618 by minus one and the other components by plus one. Therefore the sign of all odd components is changed.

A modulated block 620 with a length of 8M points is therefore obtained. The frequency modulation is equivalent to swapping the two halves a and b of convolved block 613. One then adds this convolved block 620 to block 619 with which it half-overlays in time. A combined block 621 with a length of 8M points is therefore obtained. This block is representative of temporal components b+c in its first part and a+d in its second part.

Next, one performs a first subsampling in which one selects the even components of the combined block 621 with a length of 8M points. One then obtains an even block 622 with a length of 4M points that is multiplied by ½ before adding block 617 which produces the compensation block 623. As the discrete Fourier transform is periodic, this addition in the frequency domain goes back to temporally adding the signal b+c+(d+a) on interval TR.

In parallel, one performs a second subsampling in which one selects the odd components from the combined block 621 with a size of 8M and one obtains an odd block 624 with a length of 4M points. One performs an inverse transform of this odd block 624 and one obtains an inversed odd block 625 that is situated in the temporal domain. This inversed odd block 625 contains the signal ((b+c)−(d+a))W(n), W(n) being a weighting factor represented by a sequence of 4M complex numbers. The signal ((b+c)−(d+a))W(n) in fact corresponds to a signal ((b+c)−(d+a)) multiplied by a complex exponential.

One then multiplies this inversed odd block 625 by the conjugated complex sequence of W(n) and one divides the result obtained by 2. A normalized odd block 626 with a length of 4M points is obtained, which contains the real time signal ½((b+c)−(d+a)). This signal is added to the temporal output of the filter on the interval TR.

With relation to the real contribution (b+c) of blocks 613 and 614 on interval TR, one has therefore introduced an error of ½((b+c)+(d+a)). But this error is exactly compensated for by the combination of blocks 617 and 622, that replaces block 617 with the compensation block 623.

Therefore, in the invention, it comes down to an inverse discrete Fourier transform of order 2P×M to process an inverse discrete Fourier transform of order 2(P+1)×M. The same is true of all orders since several levels exist in the processing of blocks by slots. A considerable reduction in calculation time is obtained.

In practice, one starts by calculating the inverse discrete transforms of the longest multiplied blocks, or the multiplied blocks with a length of 16M points for the example. In general, the inverse transform calculations are done in a real-time architecture comprising independent processors that process each multiplied block. Furthermore, a meter system that allows the determination at all times of how much multiplied signal block should be added for each time interval is used.

In another embodiment of the method, one uses a frame of blocks comprising repetitions of blocks such as M, M, 2M, 2M, 4M, 4M, 8M, 8M for example. This repetition of blocks allows the computing load of the processors to be better distributed in such a way as to dispose a calculation delay that is all the larger as the Fourier transforms have a significant order.

In a variation, the coefficients of filter HDD 78 are not divided into four slots. In fact, the division of coefficients of filter HDD 78 into slots depends on the length of the impulse response of filter HDD 78 and therefore on the number of filtering coefficients of filter HDD 78. Thus, in other examples of embodiments, the filtering coefficients of filter HDD 78 may be divided into five or six different slots of coefficients.

This method for reconstructing the output signal may be implemented in applications other than the processing of an electric sound signal and may therefore comprise an invention in itself.

FIG. 6*c* shows according to this variation an example of an embodiment of filter HDD with a structure over several stages. The coefficients of filter HDD of the example have been divided into five slots of lengths M, 2M, 4M, 8M and 16M points. An input signal is divided into a block with a length of M points.

In stage A, in a first step 631 a Fourier transform of multiplied block 630, with a size of 2P points, here 32 points, is carried out.

Then in a second step 632, the multiplied block is modulated by multiplying the negative components of the multiplied block by −1.

In a third step 633, the result of this modulation is added to an unmodulated multiplied block with a size of 32 points wherein the block corresponding in time is overlayed with the block corresponding to the result of the multiplication in time. A combined block is obtained.

In a fourth and fifth step 634 and 635 that have preferably been carried out in parallel, the odd components and the even components of the combined block are isolated and one obtains an odd block and an even block respectively.

In a sixth step 636, an inverse discrete Fourier transform is carried out on the odd block and the inversed odd block obtained is multiplied by the complex coefficient that is the conjugate of the complex number W(n). The result of this multiplication is multiplied by ½and one then obtains a normalized odd block that is added to the temporal output of the filter over the interval TR.

In a seventh step 637, the even block is added to the multiplied auxiliary block 617 (FIG. 6*b*) with a length of 16 points wherein the block corresponding in time is aligned with the block corresponding to the even block in time. This auxiliary block is produced by a Fourier transform 638 over 2(P−1) points (here over 16 points).

The addition block obtained in the seventh step is removed and is processed in a second stage B. More precisely, operations 631-637 are repeated in 639-643 on the addition block with a length of 16 points. In step 640 of stage B, the same multiplied block with a size of 6 is added that was added in step 637 of stage A. The normalized odd block obtained at the end of step 643 of stage B is also added to the reconstructed signal.

A total of five stages are performed in such a way as to add in a last step 645 a multiplied block with a length of 2 points to the last even block obtained.

In practice, steps such as 649, 650 and 651 may be carried out at any useful time in the method, in which the blocks of signals corresponding to the blocks multiplied during the operations carried out in steps 633 and 645 are delayed and synchronized.

In practice, each step corresponds to a cell. A cell may correspond to an electronic circuit dedicated to particular functions. A cell may be made from logic gates. In a variation, a cell corresponds to a program memory within which instructions associated with a microprocessor are stored.

FIG. 7 shows an embodiment of the method according to the invention for electric sound signals coming from a car radio.

In this embodiment, different delays t1-t4 are introduced in the frequency bands of right and left processed electric sound signals 701 and 702 in such a way as to refocus and focalize an overall sound image obtained.

More precisely, an electric sound signal on the right 113 and an electric sound signal on the left 117 are processed through a filter 700 corresponding to that which includes elements contained within the dashed lines of FIG. 1 as well as the adders 5 and 6. A processed electric sound signal on the right 701 that may be observable as the output from adder 5 and a processed electric sound signal on the left 702 that is observable as the output from adder 6 of FIG. 1 is obtained.

Then, for each processed signal 701 and 702, high-frequency components and low-frequency components are filtered by using a high-pass filter 703 and a low-pass filter 704. Therefore, at the output of the high-pass filter, for the processed electric sound signal on the right 701, a high-frequency electric sound signal 705 is obtained. And in the output of the low-pass filter, one then obtains a low-frequency electric sound signal 706.

One then introduces a first delay t1 in the high-frequency electric sound signal 705 by using a first delay cell 707.1. And a second delay t2 is introduced in the low-frequency electric sound signal 706. From the output of the first delay cell 707.1, one then obtains a delayed high-frequency electric signal 708. And from the output of the second delay cell 707.2, a delayed low-frequency electric sound signal 709 is obtained.

The delayed high-frequency electric sound signal 708 and the delayed low-frequency electric sound signal 709 are then added through an adder 710. The added signal 711 obtained from the adder is then diffused through a first speaker 712. This first speaker 712 comprises two subspeakers 713 and 714 that distinctly diffuse the high-frequency sound signals and the low-frequency sound signals.

Filters 703 and 704, delay cells 707.1 and 707.2 and adder 710 are elements from a first processing cell 715. A second cell 715 is applied to the processed electric sound signal on the left 702. The durations of delays introduced by this second cell 715 may be identical to or different from the durations of delays t1 and t2 introduced by the first cell 715.

By combining the sound processing by filter 700 and by introducing delays in different frequency bands of sound processed by using cells 715, the listener has the sensation that the sound coming from the car speakers is both elevated and centered with relation to the windshield. The sound from the speakers also seems to come from a sound source situated behind the windshield while this sound is simply diffused by the speakers that are situated close to the floor. This sensation of elevation, centering and virtual origin from a sound source may be obtained by combining the utilizations of filter 700 and cells 715.

In a particular embodiment, the more the electric sound signals are diffused by speakers situated close to a target, the longer are the delays introduced in these signals. The more the electric sound signals are diffused by speakers situated far from a target, the shorter the delays introduced in these signals. This target may be the vehicle driver or a passenger.

FIG. 7 gives an example of an embodiment in which a delay is introduced in the high-frequency band and a low-frequency band. These frequency bands each correspond to a frequency band of one of the subspeakers that comprises diffusion speakers 712 and 714. However, for some cars comprising speakers with more than two subspeakers, it is possible to introduce delays for any frequency band. Therefore, some cars equipped with a high-end audio installation comprise speakers that have three subspeakers respectively diffusing a high-frequency sound signal, a medium-frequency sound signal and a low-frequency sound signal. For these speakers from these luxury cars, one implements three filters inside the cell 715. In an example, these three filters correspond to a high-pass filter, a band-pass filter and a low-pass filter.

This method of introducing a delay in the frequency band of a sound signal may be implemented independently from filter 700 and may therefore comprise an invention in itself.

The invention claimed is:

1. A method for processing an electric sound signal wherein a right sound signal and a left sound signal are diffused in a reflective environment by two speakers and are detected by an acoustic detector comprising a right microphone and a left microphone, the method comprising:

computing a first temporal filter representing a first acoustic transformation applied to the right sound signal by the reflective environment between the right speaker and the right microphone;

computing a second temporal filter representing a second acoustic transformation applied to the right sound signal by the reflective environment between the right speaker and the left microphone;

computing a third temporal filter representing a third acoustic transformation applied to the left sound signal by the reflective environment between the left speaker and the left microphone;

computing a fourth temporal filter representing a fourth acoustic transformation applied to the left sound signal by the reflective environment between the left speaker and the right microphone;

modifying each of the temporal filters by an operation including at least one of:

normalizing the temporal filters on a maximum of a direct field or on a quadratic average, temporal resetting of the temporal filters in relation to each other, providing a time lag of samples from a temporal filter, masking of at least some of the samples from the temporal filter, and altering an amplitude of at least some of the samples from a temporal filter;

applying the modified temporal filters to a right original sound signal and a left original sound signal to obtain processed electric sound signals by:

applying a first modified temporal filter to the right original electric sound signal to obtain a first processed electric sound signal, applying a second modified temporal filter to the right original electric sound signal to obtain a second processed electric sound signal, applying a third modified temporal filter to the left original sound signal to obtain a third processed electric sound signal, and applying a fourth modified temporal filter to the left original sound signal to obtain a fourth processed electric sound signal, adding the first and fourth processed electric sound signals and the right original sound signal to obtain a right processed electric sound signal;

adding the second and third processed electric sound signals and the left original sound signal to obtain a left processed electric sound signal; and diffusing the right processed electric sound signal and the left processed sound signal.

2. The method according to claim 1, wherein the computing includes:

producing a white acoustic sound signal on the right with an acoustic diffusion system, from a white noise electric signal;

detecting with the acoustic detector a corresponding acoustic signal received in the form of a modified white received electric sound signal on the right and a modified white electric sound signal on the left corresponding to a reception of the white acoustic sound signal on the right;

producing a frequency spectrum on the right corresponding to a white noise electric signal on the right, and two received frequency spectrums, respectively corresponding to the modified white received electric sound signal on the right and to the modified white received electric sound signal on the left;

producing a first set of coefficients from frequency filters from the frequency spectrum on the right and from the frequency spectrum of the modified white received electric sound signal on the right;

producing a second set of coefficients from frequency filters from the frequency spectrum on the right and from the frequency spectrum of the modified white received electric sound signal on the left;

producing a white acoustic sound signal on the left with an acoustic diffusion system, from a white noise electric signal;

detecting a corresponding acoustic signal received in the form of a modified white received electric sound signal on the left and a modified white electric sound signal on the right corresponding to a reception of the white acoustic sound signal on the left with the acoustic detector;

producing a frequency spectrum on the left corresponding to a white noise electric signal on the left, and two received frequency spectrums, respectively corresponding to the modified white received electric sound signal on the left and to the modified white received electric sound signal on the right;

producing a third set of coefficients from frequency filters from the frequency spectrum on the left and from the frequency spectrum of the modified white received electric sound signal on the left;

producing a fourth set of coefficients from frequency filters from the frequency spectrum on the left and from the frequency spectrum of the modified white received electric sound signal on the right, said four sets of coefficients forming a quadrille of coefficient sets; and filtering the electric sound signals on the right and left with frequency filters whose parameters are given by said quadrille.

3. The method according to claim 2, wherein:

the sets of coefficients are produced from the two spectrums by a component to component complex division of complex points from these components in each of these spectrums.

4. The method according to claim 2 wherein said computing includes the steps of producing coefficients of the four temporal filters from coefficients of the first, second, third and fourth frequency filters respectively.

5. The method according to claim 4 wherein the coefficients from a temporal filter whose rank is greater than a given rank are eliminated and wherein the coefficients from a temporal filter whose value is lower than a threshold are eliminated.

6. The method according to claim 2 wherein quadrilles of sets of coefficients are produced for different configurations of the acoustic diffusion system and or for different rooms in which the acoustic diffusion system is placed for the production of coefficients.

7. The method according to claim 6, wherein one of the configurations is a configuration in a cone of confusion.

8. The method according to claim 1 wherein combined electric sound signals on the right and left are filtered on given frequency bands and, a delay is introduced in each of these frequency bands.

9. The method according to claim 8, wherein combined electric sound signals on the right and left are filtered by using a high-pass filter, and-high-frequency electric sound signals are obtained, combined electric sound signals on the right and left are filtered by using a low-pass filter, and low-frequency electric sound signals are obtained.

10. The method according to claim 9, wherein a first delay is introduced in the low-frequency electric sound signals and a second delay is introduced in the high-frequency electric sound signals.

11. The method according to claim 10, wherein the first delay introduced in the low-frequency electric sound signal obtained from the combined electric sound signal on the right is different from the first delay introduced in the low-frequency electric sound signal obtained from the combined electric sound signal on the left, and the second delay introduced in the high-frequency electric sound signal obtained from the combined electric sound signal on the right is different from the second delay introduced in the high-frequency electric sound signal obtained from the combined electric sound signal on the left.

12. The method according to claim 1 wherein, to filter, a signal transform of an electric sound signal is performed and a transformed signal is obtained, the transformed signal is multiplied by filtering coefficients and a multiplied signal is obtained, the multiplied signal is transformed by an inverse transform, and the filtering coefficients are coefficients of finite impulse response filters.

13. The method according to claim 12, wherein, to perform the transform a frame of the electric sound symbol is divided into N blocks, the transform of each of the blocks is performed, the filtering coefficients are divided into N packets of coefficients, the N blocks of input data are multiplied two by two by the N packets of filter coefficients, and the multiplied blocks are added to obtain the multiplied signal.

14. The method according to claim 13, wherein to divide the frame and to calculate the transform, the transform of each of the N blocks is calculated successively, and the transformed blocks are transmitted to a delay line at N outputs.

15. The method according to claim 13 wherein, to divide the frame into N blocks, an electric sound signal is stored in a circular buffer memory with capacity proportional to the nth of the frame of the electric sound signal.

16. The method according to claim 13 wherein, to divide a frame of the signal into N blocks, double blocks are formed that are overlayed on each other by half, the transform of each of the double blocks is performed, the N packets of coefficients are completed by the constant samples to obtain double packets, each of the N double blocks are multiplied by one of the N double packets and multiplied double blocks are obtained, and the multiplied blocks are extracted from the multiplied double blocks.

17. The method according to claim 1 wherein, to compute, an artificial head that comprises two acoustic detectors is placed in a median axis of two acoustic diffusion systems, an electric signal in the form of a Dirac comb is applied simultaneously as input to the two acoustic diffusion systems, and these direct fields and these crossed fields received by the acoustic detectors are aligned two by two by varying the position of the artificial head.

18. The method according to claim 1 wherein, to diffuse, equalization functions are incorporated in the cells situated upstream from the Fourier transform cells.

19. The method according to claim 18, wherein the frequency components of four frequency filters obtained from the four modified temporal filters are adjusted independently.

20. The method according to claim 1 wherein, to diffuse, at least one of a phase and an amplitude of temporal filter coefficients are modified along all or part of an impulse response.

21. The method according to claim 12, wherein, to perform the transform, the filtering temporal coefficients are divided into Q slots (HDD1-HDD4) of coefficients with progressive length M, 2M, 4M, . . . (2^(Q-1))M points, the transform of each of these slots is performed and transformed slots are obtained, a frame of the electric sound signal is divided into blocks (x1-x8) with a length of M points, the transform of each of these blocks is performed and transformed blocks are obtained, and the transformed blocks are multiplied by the transformed slots and corresponding multiplied blocks are obtained by inverse transformation to the blocks of signals that half-overlap each other two by two in time.

22. The method according to claim 21 wherein, to perform the inverse transformations of multiplied blocks, a first multiplied block with a length of 2P×M points, a temporal block corresponding in time to this first multiplied block, a second multiplied block corresponding in time to a second temporal block are modulated, this first and second temporal block are overlayed by half in time, and a modulated block with a length of 2P×M points is obtained, then this modulated block with a length of 2P×M points is added to the second block, and a combined block with a length of 2P×M points is obtained.

23. The method according to claim 22, wherein, to modulate, the odd components of a multiplied block with a length of 2M points wherein the block corresponding to it in time is overlayed with another is multiplied by −1, and the even components are multiplied by +1.

24. The method according to claim 22 wherein, to perform the inverse transformations of multiplied blocks with a length of 2M points, the even components of the combined block with a length of 2P×M points are selected, and an even block with a length of 2(P−1)×M points is obtained this even block is multiplied by ½ and the result of this multiplication is added to an auxiliary multiplied block with a length of 2(P−1)×M points, and a compensation block is obtained.

25. The method according to claim 22 wherein to perform the inverse transformations of multiplied blocks with a size of (2P)M, the odd components of the combined block with a size of 2P×M points are selected, and an odd block with a length of 2(P−1)×M points is obtained, an inverse transform of this odd block with a length of (2(P−1))M points is performed, and an odd inversed block is obtained that is situated in a temporal domain, then the odd inversed block is multiplied by a complex coefficient conjugated from a complex coefficient W(n), and an odd normalized inversed block with a length of 2(P−1)×M points is obtained.

26. The method according to claim 1, wherein a time lag is introduced between the original electric sound signals and the processed electric sound signals.

* * * * *